United States Patent [19]

Tribout

[11] 4,162,952
[45] Jul. 31, 1979

[54] APPARATUS FOR ELECTROLYSIS BY PROJECTION

[75] Inventor: Michel Tribout, Breuillet, France

[73] Assignee: Societe Anonyme dite: F.M.C., Pierrelaye, France

[21] Appl. No.: 880,845

[22] Filed: Feb. 23, 1978

[51] Int. Cl.² ............... C25D 7/06; C25D 17/00
[52] U.S. Cl. ................. 204/224 R; 204/198; 204/206; 204/207
[58] Field of Search ............. 204/224 R, 206, 207, 204/28, 198, 15

[56] References Cited

U.S. PATENT DOCUMENTS

| | | | |
|---|---|---|---|
| 3,334,028 | 8/1967 | Polichette | 204/15 |
| 3,468,785 | 9/1969 | Polichette | 204/224 R |
| 3,640,854 | 2/1972 | Klein | 204/28 |
| 3,847,780 | 11/1974 | Burck | 204/224 R |
| 3,896,010 | 7/1975 | Vetter | 204/206 X |
| 3,963,588 | 6/1976 | Glenn | 204/224 R X |
| 4,030,999 | 6/1977 | Allen | 204/206 |
| 4,036,725 | 7/1977 | Allen et al. | 204/206 |

FOREIGN PATENT DOCUMENTS 2408617 9/1974 Fed. Rep. of Germany .
2508777 9/1976 Fed. Rep. of Germany .
527912 10/1972 Switzerland .

*Primary Examiner*—Arthur C. Prescott
*Attorney, Agent, or Firm*—Brisebois & Kruger

[57] ABSTRACT

Apparatus for electrolysis by projection for deposit of or removal of a metal material on parts which are at least partially electrically conducting, characterized by the fact that it comprises at least one jet fed by a pump and which continuously projects the electrolyte onto a defined area on the surface of the parts, these parts being placed on a support with a device insuring their electrical connection to a direct current polarity while the other polarity is connected to an electrode positioned in the hydraulic circuit upstream of the jet.

4 Claims, 5 Drawing Figures

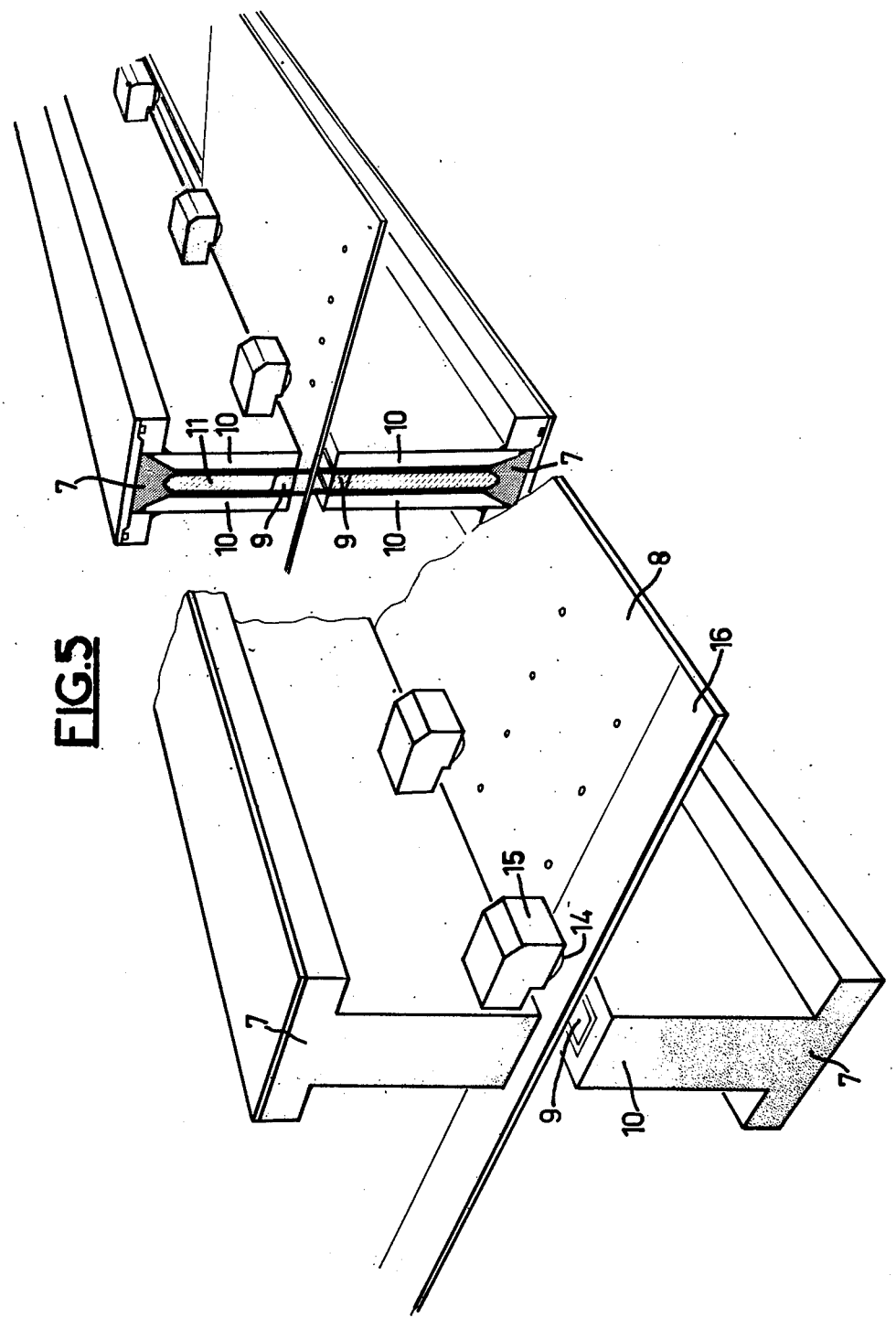

APPARATUS FOR ELECTROLYSIS BY PROJECTION

The invention relates to the electrolytic treatment of parts, that is, the performing by electrolysis of the deposition of or the removal of a metal material on parts which are at least partially electrically conducting.

To effect this treatment, one previously has always placed the parts in a bath of electrolyte with at least one metal electrode place in the same bath at a certain distance from the parts, this electrode being connected to a one direct current polarity while the parts are connected to the other polarity, generally by the intermediary of frames and connectors or by direct contact with a wall in the case of electrolysis in a drum. The parts are anode or cathode depending upon whether there is a removal or a deposit of material.

As a result, with the usual procedures, there is always a very large volume of electrolyte, most often in open vats, producing emanations and atmospheric pollution, with the need for a large voltage, due to the distance between the electrode and the parts, and a large current proportional to the total surface of the parts, having in addition relatively significant treatment defects due to the effects of the edges, that is to say, the electrical field, whose electrolytic activity, is concentrated in the parts which project, or in the edges of plane parts, attenuates very greatly in concave parts or in the center of plane parts, to the extent that there is almost a complete cancellation of effects inside deep holes. In addition, in the case of treatment on frames, extremely important manipulations are linked to the attaching and removing of parts, and to the manipulation of frames from the electrolysis vats to the rinsing vats, wih a loss of time due to the need to stop the treatment during the manipulation and the draining of the frames, and a significant loss of electrolyte to the rinse water, and poses treatment problems to avoid water pollution.

The aim of the invention is to realize a new electrolysis device which eliminates the preceding disadvantages, that is, which functions with a small volume of electrolyte and a small electrical voltage while eliminating edge effects, simplifying handling, and reducing atmospheric and hydrological pollution to a great extent.

The invention consists in operating by electrolytic projection on the surface to be treated by means of a jet supplied by a pump and continuously projecting the electrolyte on one limited area of the surface of the parts, these parts being placed on a support insuring their electrical connection to one polarity, while the other polarity is connected to another electrode placed in the electrolyte circuit upstream of the jet. The jet can be of an appropriate shape for the surface to be treated and can be stationary, the same as the part supporting this surface. One can also use a ramp or a jet in the form of a fixed liquid blade or sheet acting on moving parts, with a sliding electrical connection for the latter or for their support. In the particular case of flat parts, such as printed circuits, the support can be constituted of driving rollers with direct electrical connection to the parts by brushes. The electrolytic treatment chambers can be supplemented by chambers for different treatments such as rinsings or chemical treatments, with watertight seals and with lips placed between the chambers and possibly excess gaseous pressures which permit obtaining in an automatic and continuous manner, all of the manufacturing operations for a complete printed circuit, with no limitation as to length.

Other particulars of the invention will be apparent from the description which follows of various embodiments taken as examples and shown in the attached drawings, in which:

FIG. 5 is a partial view in perspective of the essential parts of the electrolysis chamber.

Figure 1:
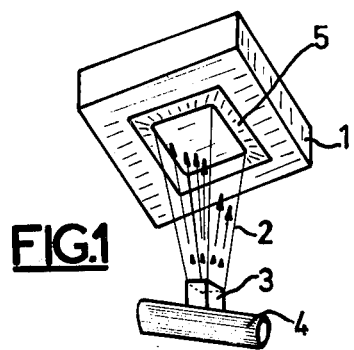
FIGS. 1, 2 and 3 show schematically and in perspective, jets in various shapes for the localized treatment of parts.
Figure 2:
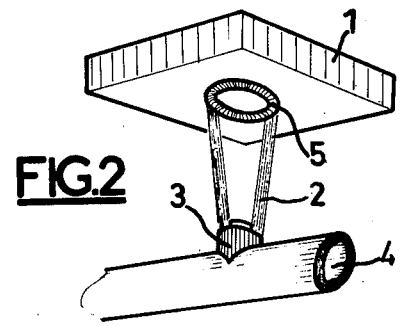
Figure 3:
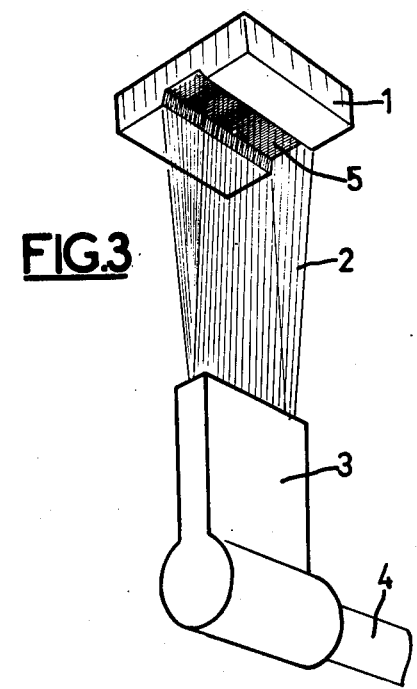

According to the invention, and as appears schematically for example in FIG. 1, the parts 1 to be treated are not immersed in a bath but in a gaseous atmosphere, and one projects on their surface a jet 2 of electrolyte formed by a projection nozzle 3 fed by a pipe 4. In the case where one uses a single jet, it is preferably rising, as shown in FIGS. 1 through 3, to facilitate the removal of the electrolyte which falls back by gravity into a tank which is not shown, from which it is immediately recovered, preferably by an immersed pump, and sent back into pipe 4. As a result, one uses only a very small volume of electrolyte without regard to the size of parts 1.

According to the invention, one of the electrodes, for example, the anode, in the case of electrolytic deposition, is placed inside pipe 4, that is, upstream of nozzle 3 forming jet 2, while part 1 is naturally placed downstream of the jet. It can naturally act as an anode, soluble or not, in the case of deposition. According to one essential particular of the invention, the jet can have a shape fitting area 5 to be treated, which gives various configuration according to the cases of FIGS. 1 through 3. As a result, the electric field producing the electrolysis happens to be concentrated in the section of the jet alone, that is, in area 5 alone to be treated, which eliminates border effects by permitting a much more homogenous and effective treatment, even in the case of treatment of hollow surfaces as in the case shown in FIG. 3. In fact, the untreated area is not itself irrigated or submitted to the electric field so that one obtains on hollow surface 5 a uniform field without requiring any shaped electrode.

This electrolytic treatment from a distance can, as in the example of FIGS. 1 to 3 which will be described, be applied between one or several fixed jets and a part, likewise fixed, connected electrically to the other polarity. However, the invention is especially advantageous in the case of continuous treatment, that is, in using a bank or system having numerous nozzles 3 or by creating a flat liquid sheet or plate disposed in a fixed position transversely of the displacement path, the parts to be treated being then displaced in a continuous movement to go through the liquid sheet, the electrical connection being effected by sliding contacts, either directly on the parts, or on a support supporting these parts.

For example, for the treatment of small parts usually treated in tanks, with the disadvantages previously stated, especially for the protection of openings, one can, according to the invention place the parts in bulk on an endless horizontal grill moving through the zone of the jets which are disposed preferably under the rack, the electrical connection with the parts being achieved by means of upper metal brushes acting directly on the parts, or else by the grill if it is electrically conductive.

Of course, the treatment chamber or enclosure inside of which the jets are produced is entirely filled with a gaseous atmosphere and preferably closed at the upper part as well as at the lower part to avoid efflux and pollution, the entrance and exit for the parts and for the grill being formed by a straight slot preferably having watertight curtains.

The embodiment of the continuous process is particularly facilitated in the case of flat parts such as rectangles or strips of sheet metal in which one realizes an electrolytical electroformation using masks, deposited for example by a photochemical process, in order to make grids for filters or electric razors. In the case where these parts have a special length, the grill can advantageously be removed and replaced by a series of support rollers or pairs of rollers facing each other and insuring the continuous procession of parts through the liquid treatment sheet. In this case, the electrical connection is made directly on the part or on the edge of the place designed to receive it. For these flat parts, attaining impervious seals at the entrance and the exit of the treatment chambers is particularly facilitated. As a result, there is a quasi-total suppression of electrolyte loss eliminating problems of treatment of the rinse waters. On the other hand, being given in this case the perpetual recirculation of a small volume of electrolyte with very little renewal, it is necessary to consider a treatment for regeneration of the electrolyte.

Among the flat parts automatically and continuously treatable by the apparatus of the invention, particular mention must be made of printed circuits because of the large use which is made of them. One will recall in particular the process for making double face printed circuits starting with bakelite board faced with copper on both sides and consisting in, first of all, drilling the holes for junctions and connections, then applying a photoresistent liquid or sheet to both sides, photographic exposure of the photoresistant material on both sides of the two circuit designs to be realized, the elimination of the non-exposed photoresist around the openings and along the circuit strips, chemical treatment of the inside of the openings to make them conductive, then the electrolytic deposition of copper to the interior of the openings to make the connections between the two surfaces, the electrolytic reinforcement of copper, then electrolytic reinforcement by an alloy of tin-lead, finally the elimination of the exposed photoresistant material and the chemical etching treatment of the copper over all parts which have not been protected by the tin-lead, with final rinsing and all the necessary intermediate rinsings.

Conforming to the invention, such a manufacturing process for double face printed circuits is realizable in its entirety, automatically and continuously, by juxtaposing a certain number of electrolytic chambers and chambers for rinsing or chemical treatment, including the application of the photoresistant material and photographic exposure. The plates, simply cut up and perforated and introduced flat to one end of the manufacturing line, are transported from one end to the other by driving rollers of the type previously indicated and pass from chamber to chamber through water tight seals designated by 6 in FIG. 4, to exit completed at the other end.

Figure 4:
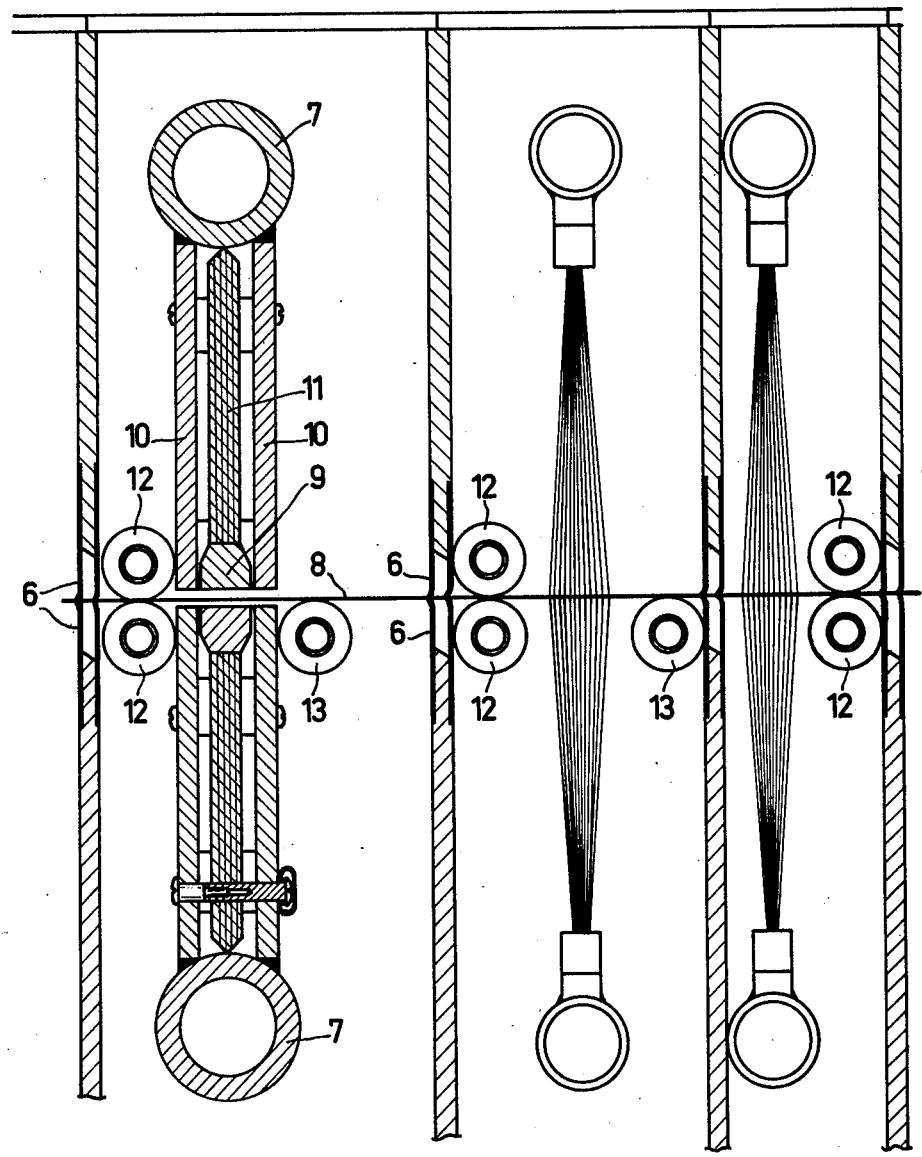
FIG. 4 is a longitudinal vertical section of one electrolysis chamber preceded by two chambers for different treatments.

One sees in particular in the left part of FIG. 4, an electrolysis chamber according to the invention with pipes 7 for supplying of the electrolyte forming, on each surface of plates 8, jets not shown in the form of two liquid sheets or plates flowing respectively between a central core 9 and one or the other of two exterior walls 10 joined to the corresponding pipe 7. In this rectangular conduit constituted by these two walls 10 is disposed an electrode 11 which is thus, conforming to the invention, upstream of the jets, while the parts 8 to be treated, are downstream from them. The driving rollers 12 and support rollers 13 are shown in FIG. 4, are of course all synchronized between the various chambers, and the electrical supply brushes 14 are shown in FIG. 5, borne by arms 15. These brushes act directly on the areas of the circuit devoid of photoresist or on marginal areas 16, which are later removed.

By virtue of the invention, one can thus realize automatically and continuously the complete manufacturing cycle for various printed circuits, except for the drilling, with a large productivity because of the concentration of the field in the liquid sheets and with the advantages already explained coupled with the small quantity of electrolyte used, and the small consumption of electrolyte, the absence of atmospheric and hydrological pollution and the absence of the border effect. In addition, the installation is of relatively reduced size and nevertheless permits the treating of printed circuits without restrictions in the way of length.

What is claimed is:

1. Electrolysis apparatus for deposition or removal of a metal on at least partially electrically conductive parts comprising a closed chamber, means for conveying flat parts through said chamber along a pre-determined path, means for projecting a sheet of electrolyte transversely of and toward said path so that the sheet of electrolyte impinges on the articles moving along the path, electrode means upstream of said projecting means for electrical connection to one side of an energizing circuit, means for connecting said flat parts to the other side of the energizing circuit during travel of the parts through said chamber, additional chambers adjacent to said first mentioned closed chamber, and wherein an exit opening of one chamber is the inlet opening of the next adjacent chamber, seal means between said chambers for isolating said chambers from each other while permitting the passage of said flat parts through said chambers, said seal means permitting maintenance of a neutral gas pressure within said chambers to prevent entrance of atmospheric air into said chambers, and means in said additional chambers for further treating said parts by projecting a liquid sheet toward said parts in said additional chambers.

2. Apparatus according to claim 1 wherein said means for electrical connecting to said parts comprises electrical brush means engaging electrically conductive areas of said parts.

3. Apparatus according to claim 1 wherein said means for projecting a sheet of electrolyte comprises means for directing parallel sheets of electrolyte toward surfaces of said parts.

4. Electrolysis apparatus for deposition or removal of a metal on at least partially electrically conductive parts, said parts being generally flat and moving continuously along a substantially horizontal path in a substantially horizontal position, comprising a closed chamber with inlet and exit openings; means in the chamber for projecting a sheet of electrolyte toward said parts transversely to said horizontal path; electrode means upstream of said projecting means and electrical connections between said electrode means and said parts; at least one support roller located under and engaging said parts for supporting them; at least a pair of driving rollers engaging both faces of said parts for moving them along said horizontal path; said support and driving rollers being located along said path with said support roller on one side of said projected sheet of electrolyte, and said driving rollers on the other side of said projected sheet of electrolyte; and sealing means including a pair of sealing lips engaging both sides of said parts, said sealing means being located at said openings of said chamber.

* * * * *

UNITED STATES PATENT OFFICE
CERTIFICATE OF CORRECTION

Patent No. 4,162,952   Dated July 31, 1979

Inventor(s) MICHEL TRIBOUT

It is certified that error appears in the above-identified patent and that said Letters Patent are hereby corrected as shown below:

[30] Foreign Application Priority Data

Priority February 24, 1977
France
No. 77 05482

Signed and Sealed this

Sixteenth Day of October 1979

[SEAL]

Attest:

RUTH C. MASON
Attesting Officer

LUTRELLE F. PARKER
Acting Commissioner of Patents and Trademarks